United States Patent
Callaway, Jr. et al.

(10) Patent No.: US 6,370,365 B1
(45) Date of Patent: Apr. 9, 2002

(54) SELECTIVE CALL RADIO HAVING AN INTEGRATED FREQUENCY CONVERSION CIRCUIT

(76) Inventors: Edgar Herbert Callaway, Jr., 11524 Clear Creek Pl., Boca Raton, FL (US) 33428; Scott Robert Humphreys, 6098 Terra Rosa Cir., Boynton Beach, FL (US) 33437; Keith Edward Jackoski, 15570 Rolling Meadows Cir., Wellington, FL (US) 33414

( * ) Notice: Subject to any disclaimer, the term of this patent is extended or adjusted under 35 U.S.C. 154(b) by 0 days.

(21) Appl. No.: 09/205,312

(22) Filed: Dec. 4, 1998

(51) Int. Cl.[7] .......................... H04B 1/04; H03B 19/00; G06F 17/10
(52) U.S. Cl. ........................ 455/130; 327/113; 708/300
(58) Field of Search .......................... 455/130; 708/300; 327/113

(56) References Cited

U.S. PATENT DOCUMENTS 4,893,316 A * 1/1990 Janc et al. ................... 708/300
5,140,198 A * 8/1992 Atherly et al. ............... 327/113

OTHER PUBLICATIONS

Yang, Lee & Co, A Low Jitter 0.3–165 Mhz CMOS PLL Frequency Synthesizer for 3 V/5 V Operation, IEEE Jornal of Solid State Circuits, vol. 32, No. 4, Apr. 1997, pp. 585–586.

* cited by examiner

Primary Examiner—William Cumming
(74) Attorney, Agent, or Firm—Randi L. Dulaney

(57) ABSTRACT

A selective call radio (300) includes receiver (200). The receiver in turn includes an antenna (202) for receiving a radio signal having a first operating frequency, an amplifier (204) coupled thereto for generating an amplified signal; and a frequency translation circuit (208). The frequency translation circuit includes a selectivity filter (212) and an integrated frequency conversion circuit (216). The selectivity is coupled to the amplified signal for generating a filtered signal. The integrated frequency conversion circuit is coupled to the filtered signal and is incorporated into at least one IC (integrated circuit). The integrated frequency conversion circuit includes an oscillator (220), a divider (224), and a mixer (218). A first input of the mixer is coupled to the filtered signal generated by the selectivity filter. The divider is coupled to the oscillator and its output is coupled to a second input of the mixer. The mixer generates an output signal having a second operating frequency, the second operating frequency having a frequency value different from the frequency value of the first operating frequency of the radio signal.

18 Claims, 3 Drawing Sheets

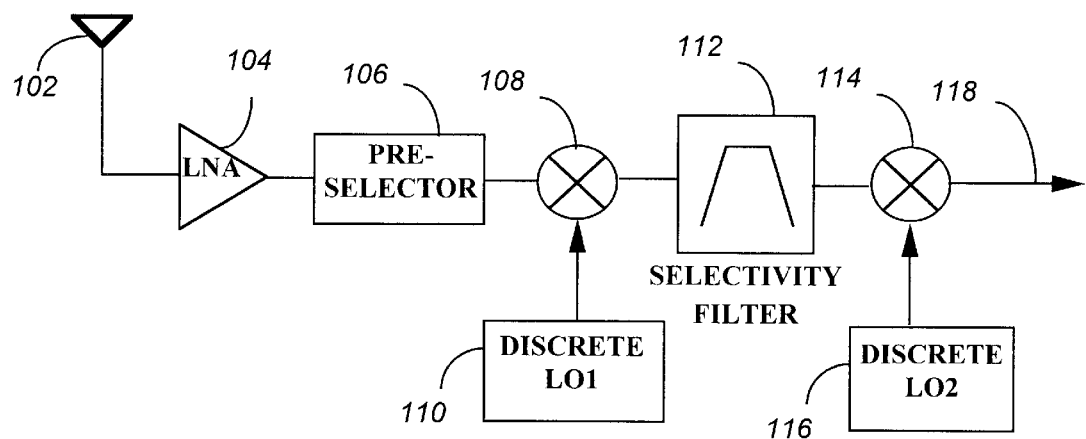
FIG. 1  *Prior Art*
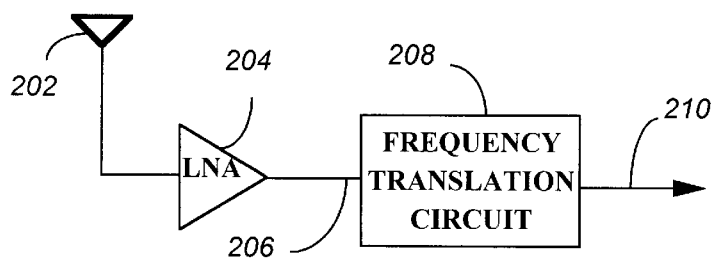
FIG. 2

208

SELECTIVE CALL RADIO HAVING AN INTEGRATED FREQUENCY CONVERSION CIRCUIT

FIELD OF THE INVENTION

This invention relates in general to selective call radios, and particularly, to a selective call radio having an integrated frequency conversion circuit.

BACKGROUND OF THE INVENTION

Consumer demand for smaller wireless products such as pagers and cellular phones continues to drive manufacturers to miniaturize circuit blocks in SCRs (selective call radios). FIG. 1 illustrates a classical structure of a prior art dual conversion radio receiver 100. This structure is commonly utilized in wireless communication products.

As shown, the dual conversion receiver 100 consists of an antenna 102 coupled in series with a low-noise amplifier 104 and a preselector filter 106. The preselector filter 106 is essentially a bandpass filter for attenuating undesired signals that are far from a desired signal in the frequency spectrum. This filtered signal is down-converted by a first mixer 108, which is coupled to an injection frequency signal from a first LO (local oscillator) 110. Once the filtered radio signal has been down-converted to an IF (intermediate frequency) signal, the IF signal is again filtered by a selectivity filter 112 to substantially attenuate undesired signals close in frequency to the desired signal. The filtered signal generated by the selectivity filter 112 is then down-converted by a second mixer 114 coupled to a second LO 116, which generates a baseband signal 118.

Presently, a large portion of the circuits of the first mixer 108 and the first local oscillator 110 are constructed with discrete electrical components, rather than integrated into one or more IC (integrated circuit) components. Similar to the first LO 110, the manufacture of the second mixer 114 and the second LO 116 also consists of discrete circuit components for generating the second injection frequency. Thus, neither the first nor the second stage of frequency conversion circuits have been fully integrated into an IC in prior art systems. Historically, designers of portable radio units have avoided the integration of the foregoing circuits, especially in narrow-band applications, due to the high side band noise resulting from the integration of local oscillators, which in turn limits the ACIPR (Adjacent Channel Interference Protection Ratio) of the receiver.

In view of a desire for miniaturizing wireless products in the consumer market, a need exists in selective call radios for integrating a frequency conversion circuit into an IC, thereby overcoming the disadvantages described in the prior art.

BRIEF DESCRIPTION OF THE DRAWINGS

The present invention is pointed out with particularity in the appended claims. However, other features of the invention will become more apparent and best understood by referring to the following detailed description in conjunction with the accompanying drawings in which:

FIG. 1 shows an electrical block diagram of a prior art dual conversion radio receiver;

FIG. 2 shows an electrical block diagram of a receiver utilizing a frequency translation circuit according to the present invention;

DESCRIPTION OF THE PREFERRED EMBODIMENT

Figure 3:
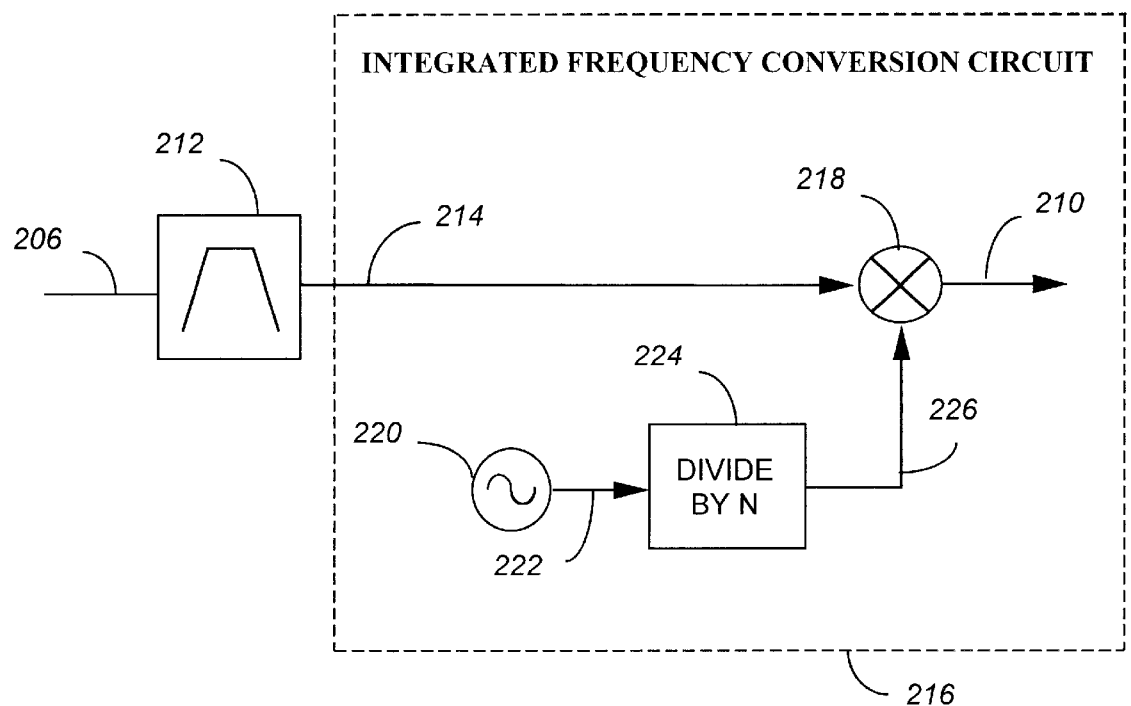
FIG. 3 shows an electrical block diagram of a first embodiment of the frequency translation circuit of FIG. 2 according to the present invention.

FIG. 2 shows an electrical block diagram of a receiver 200 utilizing a frequency translation circuit 208 according to the present invention. The receiver 200 comprises an antenna 202, a LNA (low-noise amplifier) 204, and a frequency translation circuit 208. The antenna 202 is coupled to the LNA 204, which amplifies a radio signal received by the antenna 202, thereby generating an amplified signal 206 having a first operating frequency. The amplified signal 206 is coupled to the frequency translation circuit 208 for down-converting the amplified signal 206 to an IF (intermediate frequency) signal 210 or a baseband signal 210.

FIG. 3 shows an electrical block diagram of a first embodiment of the frequency translation circuit 208 of FIG. 2 according to the present invention. As shown, the frequency translation circuit 208 comprises a selectivity filter 212, and an integrated frequency conversion circuit 216. The selectivity filter 212 receives the amplified signal 206, and generates a filtered signal 214 representative of the amplified signal 206 with a substantial portion of undesired frequency signals attenuated. Preferably, the selectivity filter 212 consists of a conventional crystal filter having a center frequency substantially near the carrier frequency of the amplified signal 206. Alternatively, however, the selectivity filter 212 may consist of a conventional SAW (Surface Acoustic Wave) filter. It will be appreciated that other filter structures suitable to the present invention may also be used.

The components of the integrated frequency conversion circuit 216 are preferably incorporated into at least one IC (integrated circuit). The fabrication technology used for manufacturing the integrated frequency conversion circuit 216 is preferably a sub-micron semiconductor process of, for example, 0.5 um or less. The sub-micron process used may consist of any one of several semiconductor technologies or combinations thereof such as, for example, CMOS (Complementary Metal Oxide Semiconductor), BI-CMOS (Bipolar CMOS), or GaAs (Gallium Arsenide) technologies, just to mention a few. It will be appreciated, however, that other manufacturing technologies suitable for operation with the present invention may also be used. FIG. 3 depicts the elements of the integrated frequency conversion circuit 216. As just noted, each of these elements is preferably incorporated into one or more ICs. However, for the present discussion, it is assumed that all the elements shown are incorporated into a single IC.

Figure 4:
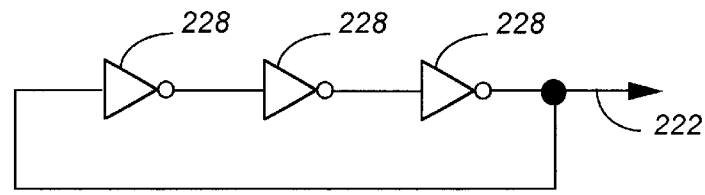
FIG. 4 shows an electrical block diagram of an embodiment of the oscillator of FIGS. 3 and 5 according to the present invention.

As illustrated in FIG. 3, the integrated frequency conversion circuit 216 comprises an oscillator 220, a divider 224, and a mixer 218. An output 222 of the oscillator 220 is coupled to an input of the divider 224. The oscillator 220 is preferably a ring oscillator depicted by way of example in FIG. 4 as having three inverters. The ring oscillator used by the present invention preferably consists of a prime number of conventional inverting amplification stages 228 (shown by way of example as conventional logic inverters) coupled in series and in a loop. Alternatively, inverting stages of other types such as differential pairs may also be used.

Due to improvements in the speed/power ratio of CMOS IC devices, the current drain of high-frequency ring oscillators has become quite reasonable. For example, at 1 Volt, current drains of less than 40 uA are possible for CMOS circuits operating at frequencies as high as 800 MHz in 0.25 um fabrication processes. This dramatically low current is due in part to the reduction of parasitic substrate capacitance in both active devices and their interconnect, and due to the oscillators not having to drive large off-chip capacitance. It will be appreciated that, alternatively, the oscillator 220 may comprise other circuits that are operational with the present invention. For example, the oscillator 220 may comprise any one of a number of resonator-based oscillators such as a conventional LC tank oscillator or a conventional MEMS (Microelectronic Mechanical System) resonator. Other oscillators, such as a relaxation oscillator, may be used as well.

The divider 224 is coupled to the output signal 222 of the oscillator 220. The divider 224 is a conventional frequency divider that is programmable by way of a processor or similar control circuit such as the one shown in FIG. 6. Alternatively, however, the divider 224 may be pre-programmed to a predetermined number-in which case, a processor or control circuit is not necessary. In yet another embodiment, the divider 224 may be designed for a specific divide ratio that is unprogrammable. As with the ring oscillator described above, the current drain of divider circuits (e.g., prescalers) operating at high frequencies has been substantially reduced as a result of improved integrated circuit technologies.

In applications where a receiver is designed for narrow-band communications, the ACIPR (Adjacent Channel Interference Protection Ratio) is an important receiver performance parameter. The ACIPR for a single-conversion superheterodyne receiver can be shown to be $$ACIPR = \frac{1/cochannel}{(BW_N \cdot S \cdot SSBNR) + S},$$

where
cochannel=demodulator cochannel rejection (a quantity>1), numeric;
$BW_N$=receiver noise bandwidth, Hz;
SSBNR=single side band noise ratio of the local oscillator, at the adjacent channel (a quantity<1) relative to carrier peak power, $Hz^{-1}$;
S=adjacent channel selectivity of the selectivity filter (a quantity <1), numeric.

As should be evident from the definitions of the variables of the foregoing equation, the denominator term, $BW_N \times S \times SSBNR$, dominates the ACIPR term. Although it is well-known that integrating a local oscillator, such as the oscillator 220 shown in FIG. 3, into an IC increases side band noise, it is apparent from the equation above that since the variable S is numerically less than unity, the integration of the oscillator 220 will have less of an effect on the term ACIPR, and thereby on the performance of the receiver to accurately demodulate a radio signal. Additionally, it is well-known in the art that frequency divider circuits reduce side band noise by a factor of 20 log N in decibels (dB), where N is the divide ratio of the divider. Hence, a divide-by-32 setting would result in a 30 dB improvement in side band noise. Thus, by integrating the oscillator 220 after the selectivity filter 212, and coupling it to the divider 224, the receiver ACIPR could be substantially similar to that of a conventional receiver designed with discrete local oscillator components. Based on these considerations, and the present improvements in semiconductor technology discussed above, the present invention preferably integrates the oscillator 220 and the divider 224 into one or more ICs.

To complete the circuit of FIG. 3, a first input of the mixer 218 is coupled to the filtered signal 214. A second input of the mixer 218 is coupled to the output signal 226 (i.e., the injection signal) generated by the divider 224. The output signal 210 generated by the mixer 218 is representative of a signal having an operating frequency different from the operating frequency of the amplified signal 206.

Several observations can be made regarding the integrated frequency conversion circuit 216 just described. First, in a first embodiment, the oscillator 220 shown in FIG. 3 may comprise a free-running oscillator. As a free-running oscillator, however, the oscillator 220 may be subject to frequency drift, which depending on the application, may not provide suitable accuracy for a proper frequency conversion of the filtered signal 214. For more accurate applications, the frequency drift of a free-running oscillator may be substantially reduced by the addition of a controller circuit 230 for controlling the frequency and/or phase of the signal generated by the oscillator 220.

Figure 5:
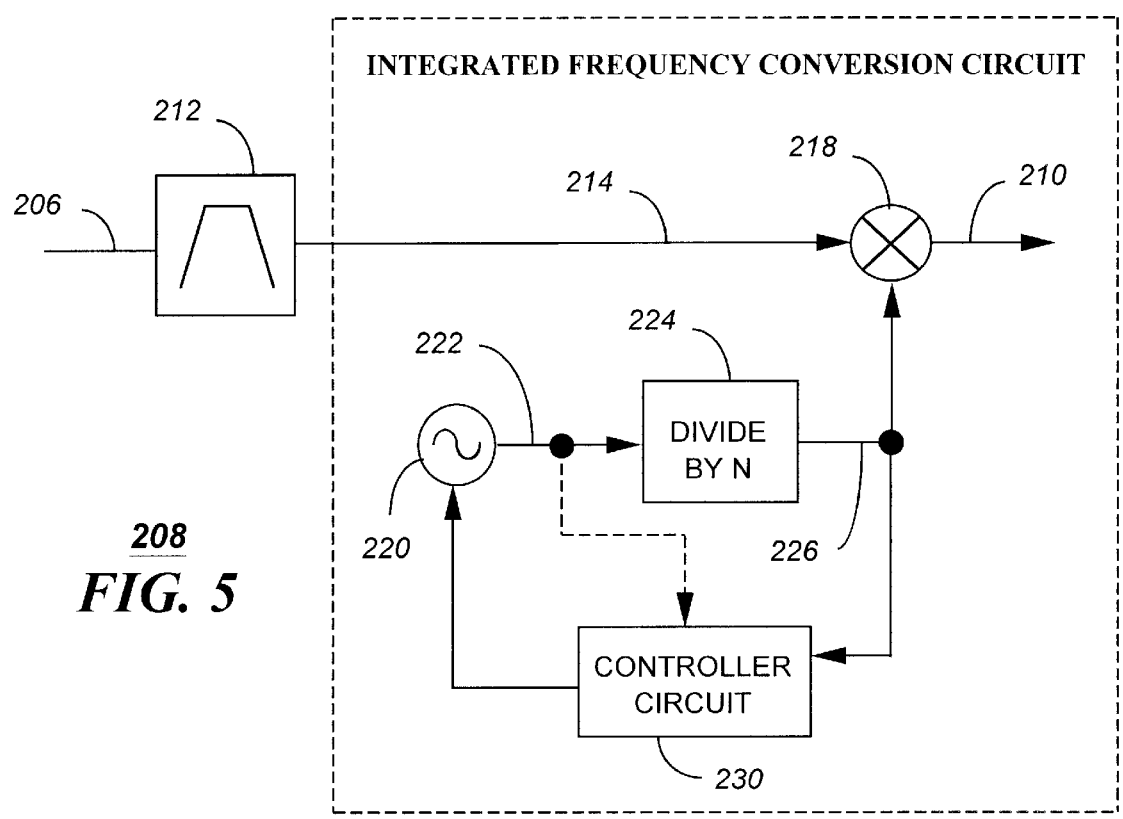
FIG. 5 shows an electrical block diagram of a second embodiment of the frequency translation circuit according to the present invention.

FIG. 5 depicts an electrical block diagram of a second embodiment of the frequency translation circuit 208, which includes a controller circuit 230 for controlling the frequency and/or phase of the oscillator 220, according to the present invention. In a first embodiment, the controller circuit 230 comprises a conventional PLL (phase locked loop) circuit for controlling the phase and frequency of the oscillator 220. Alternatively, however, the controller circuit 230 may comprise a FLL (frequency locked loop) circuit for controlling the frequency of the oscillator without regard to the phase of the signal generated by the oscillator 220. In either case, the feedback signal coupled to the controller circuit 230 may be derived from either the output signal 226 of the divider 224 or the output signal 222 of the oscillator 220.

Because of improvements in integrated circuit technology, low-current circuits such as the oscillator 220, the divider 224, and mixer 218 may be integrated into one or more ICs. It will be appreciated that additionally, the controller circuit 230 may also be integrated in the same IC as the foregoing elements. The integration of these circuit elements provides benefits not seen before in the prior art receivers. Principally, the present invention provides savings in circuit board area, and improves on the manufactureability and serviceability of one or more circuit boards that make up the aforementioned receiver 200. Consequently, the receiver 200 can be manufactured at a lower cost than that of conventional receivers.

Second, it should be noted that the present invention is not limited to a down-conversion process. Alternatively, the structure shown in FIGS. 3 and 5 may be used also for up-converting the operating frequency of the amplified signal 214 to an output signal 210 having a higher operating frequency. The present invention is especially helpful in triple conversion radio receivers, which utilize a first stage frequency converter for up-converting a radio signal to a predetermined intermediate frequency, and then utilizing a back-end two-stage frequency converter for down-converting the up-converted signal to an IF signal or baseband signal. Each of the stages may be designed with the architectures shown in FIGS. 3 and 5 as described above.

Figure 6:
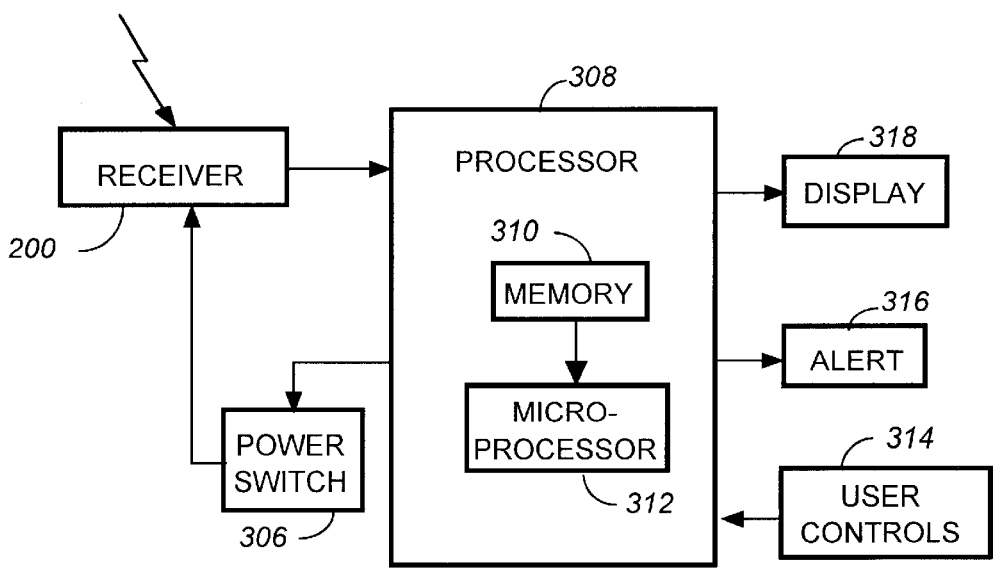
FIG. 6 shows an electrical block diagram of a SCR (selective call radio) comprising the receiver of FIG. 2 according to the present invention.

The receiver 200 just described provides the most improvement to low-cost wireless products such as selective call radios. FIG. 6 shows an electrical block diagram of a SCR (selective call radio) comprising the receiver 200 of FIG. 2 according to the present invention. Along with the receiver 200 just described, the SCR 122 further comprises a processor 308 coupled to the receiver 200 for processing demodulated signals generated thereby. A conventional power switch 306, coupled to the processor 308, is used to control the supply of power to the receiver 200 from a conventional battery source, thereby providing a battery saving function.

To perform the necessary functions of the SCR 122, the processor 308 includes a microprocessor 312, and a memory 310 that includes, for example, a random access memory (RAM), a read-only memory (ROM), and an electrically erasable programmable read-only memory (EEPROM). The processor 308 is programmed by way of the ROM to process incoming messages transmitted by, for example, a radio communication system (not shown). The processor 308 decodes an address in the demodulated data of the received message, compares the decoded address with one or more addresses assigned and stored in the EEPROM of the SCR 122, and when a match is detected, proceeds to process the remaining portion of the message.

Upon detecting a match, the processor 308 stores the message in the RAM, and a call alerting signal is generated to alert a user that a message has been received. The call alerting signal is directed to a conventional audible or tactile alerting device 316 for generating an audible or tactile call alerting signal to the user of the SCR 122. The message can be accessed by the user through user controls 314, which provide functions such as lock, unlock, delete, read, etc. More specifically, by the use of appropriate functions provided by the user controls 314, the message is recovered from the RAM, and conveyed to the user by way of a display 318 (e.g., a conventional liquid crystal display—LCD). It will be appreciated that, alternatively, the display 318 can be accompanied with an audio circuit (not shown) for conveying, for example, audio-visual voice messages.

As should be evident from the foregoing discussions, the present invention provides solutions to the needs expressed in the background of the invention. Particularly, the present invention employs the side band noise-reducing properties of divider 224, plus the selectivity of channel filter 212 prior to mixer 218, to enable local oscillator 220 to be integrated in a narrow band receiver 200 without degradation of the receiver's ACIPR. The incorporation of the receiver 200 in a SCR 300 furthers the intent of miniaturizing selective call radios for consumer use.

Although the invention has been described in terms of a preferred embodiment it will be obvious to those skilled in the art that many alterations and variations may be made without departing from the invention. Accordingly, it is intended that all such alterations and variations be considered as within the spirit and scope of the invention as defined by the appended claims.

What is claimed is:

1. A frequency translation circuit for use within a selective call radio for narrowband communications, comprising:
    a narrowband selectivity filter, an input of the narrowband selectivity filter coupled to an input signal having a first operating frequency and a plurality of undesired signals close in frequency to the first operating frequency, and an output of the narrowband selectivity filter generating a filtered signal, wherein the plurality of undesired signals are substantially attenuated in the filtered signal; and
    an integrated frequency conversion circuit coupled to the filtered signal, the integrated frequency conversion circuit incorporated into at least one IC (integrated circuit), the integrated frequency conversion circuit, comprising:
    an oscillator;
    a divider, an output of the oscillator coupled to an input of the divider; and
    a mixer, a first input of the mixer coupled to the filtered signal, a second input of the mixer coupled to an output of the divider, and an output of the mixer generating an output signal having a second operating frequency, the second operating frequency having a frequency value different from the frequency value of the first operating frequency.

2. The frequency translation circuit as recited in claim 1, further comprising a controller circuit that controls an operating frequency included in a signal generated by the oscillator.

3. The frequency translation circuit as recited in claim 2, wherein the controller circuit comprises a phase locked loop for controlling a phase and the operating frequency of the oscillator.

4. The frequency translation circuit as recited in claim 2, wherein the controller circuit comprises a frequency locked loop for controlling the operating frequency of the oscillator independent of a phase of the signal generated by the oscillator.

5. The frequency translation circuit as recited in claim 1, wherein the oscillator comprises a ring oscillator.

6. The frequency translation circuit as recited in claim 1, wherein the oscillator comprises a MEMS (Microelectro Mechanical System) resonator.

7. The frequency translation circuit as recited in claim 1, wherein the narrowband selectivity filter comprises a narrowband crystal filter.

8. The frequency translation circuit as recited in claim 1, wherein the narrowband selectivity filter comprises a SAW (Surface Acoustic Wave) filter.

9. A receiver for narrowband communications, comprising:
    an antenna for receiving a radio signal;
    an amplifier, an input of the amplifier coupled to an output of the antenna, an output of the amplifier generating an amplified signal; and
    at least one frequency translation circuit, comprising:
        a narrowband selectivity filter, an input of the narrowband selectivity filter coupled to the amplified signal having a first operating frequency and a plurality of undesired signals close in frequency to the first operating frequency, and an output of the narrowband selectivity filter generating a filtered signal wherein the plurality of undesired signals are substantially attenuated in the filtered signal; and
        an integrated frequency conversion circuit coupled to the filtered signal, the integrated frequency conversion circuit incorporated into at least one IC (integrated circuit), the integrated frequency conversion circuit, comprising:
            an oscillator;
            a divider, an output of the oscillator coupled to an input of the divider; and
            a mixer, a first input of the mixer coupled to the filtered signal, a second input of the mixer coupled to an output of the divider, and an output of the mixer generating an output signal having a second operating frequency, the second operating frequency having a frequency value different from the frequency value of the first operating frequency.

10. The receiver as recited in claim 9, further comprising a controller circuit that controls an operating frequency included in a signal generated by the oscillator.

11. The receiver as recited in claim 10, wherein the controller circuit comprises a phase locked loop for controlling a phase and the operating frequency of the oscillator.

12. The receiver as recited in claim 10, wherein the controller circuit comprises a frequency locked loop for controlling the operating frequency of the oscillator independent of a phase of the signal generated by the oscillator.

13. The receiver as recited in claim 9, wherein the oscillator comprises a ring oscillator.

14. The receiver as recited in claim 9, wherein the oscillator comprises a MEMS (Microelectro Mechanical System) resonator.

15. The receiver as recited in claim 9, wherein the narrowband selectivity filter comprises a narrowband crystal filter.

16. The receiver as recited in claim 9, wherein the narrowband selectivity filter comprises a SAW (surface acoustic wave) filter.

17. A selective call radio for narrowband communications, comprising:
a frequency translation circuit, wherein the frequency translation circuit comprises:
a narrowband selectivity filter, an input of the narrowband selectivity filter coupled to an input signal having a first operating frequency and a plurality of undesired signals close in frequency to the first operating frequency, and an output of the narrowband selectivity filter generating a filtered signal wherein the plurality of undesired signals are substantially attenuated in the filtered signal, and
an integrated frequency conversion circuit coupled to the filtered signal, the integrated frequency conversion circuit incorporated into at least one IC (integrated circuit), the integrated frequency conversion circuit, comprising:
an oscillator,
a divider, an output of the oscillator coupled to an input of the divider, and
a mixer, a first input of the mixer coupled to the filtered signal, a second input of the mixer coupled to an output of the divider, and an output of the mixer generating an output signal having a second operating frequency, the second operating frequency having a frequency value different from the frequency value of the first operating frequency.

18. A selective call radio for narrowband communications, comprising:
a receiver, wherein the receiver, comprises:
an antenna for receiving a radio signal,
an amplifier, an input of the amplifier coupled to an output of the antenna, an output of the amplifier generating an amplified signal, and
at least one frequency translation circuit, comprising:
a narrowband selectivity filter, an input of the narrowband selectivity filter coupled to the amplified signal having a first operating frequency and a plurality of undesired signals close in frequency to the first operating frequency, and an output of the narrowband selectivity filter generating a filtered signal wherein the plurality of undesired signals are substantially attenuated in the filtered signal, and
an integrated frequency conversion circuit coupled to the filtered signal, the integrated frequency conversion circuit incorporated into at least one IC (integrated circuit), the integrated frequency conversion circuit, comprising:
an oscillator,
a divider, an output of the oscillator coupled to an input of the divider, and
a mixer, a first input of the mixer coupled to the filtered signal, a second input of the mixer coupled to an output of the divider, and an output of the mixer generating an output signal having a second operating frequency, the second operating frequency having a frequency value different from the frequency value of the first operating frequency.

* * * * *